(12) United States Patent
Culca

(10) Patent No.: US 12,088,305 B2
(45) Date of Patent: Sep. 10, 2024

(54) CIRCUIT ARRANGEMENT AND METHOD FOR MONITORING A SIGNAL FORMED BY ALTERNATING VOLTAGE

(71) Applicant: Eaton Intelligent Power Limited, Dublin (IE)

(72) Inventor: Horea-Stefan Culca, Lohmar (DE)

(73) Assignee: EATON INTELLIGENT POWER LIMITED, Dublin (IE)

( * ) Notice: Subject to any disclaimer, the term of this patent is extended or adjusted under 35 U.S.C. 154(b) by 190 days.

(21) Appl. No.: 17/442,143

(22) PCT Filed: Mar. 17, 2020

(86) PCT No.: PCT/EP2020/057260
§ 371 (c)(1),
(2) Date: Mar. 15, 2022

(87) PCT Pub. No.: WO2020/193282
PCT Pub. Date: Oct. 1, 2020

(65) Prior Publication Data
US 2022/0224319 A1    Jul. 14, 2022

(30) Foreign Application Priority Data
Mar. 25, 2019  (DE) ...................... 10 2019 107 641.2

(51) Int. Cl.
*H03K 5/153* (2006.01)
*G01R 19/165* (2006.01)
(Continued)

(52) U.S. Cl.
CPC ..... *H03K 5/1536* (2013.01); *G01R 19/16547* (2013.01); *G01R 19/175* (2013.01); *H03K 19/21* (2013.01)

(58) Field of Classification Search
None
See application file for complete search history.

(56) References Cited

U.S. PATENT DOCUMENTS 3,611,162 A    10/1971   Tochitani
6,255,864 B1    7/2001   Culca
(Continued)

FOREIGN PATENT DOCUMENTS

CN    105759157 A    7/2016
CN    207164127 U    3/2018
(Continued)

OTHER PUBLICATIONS

Huang Suping, Feng Quanyuan, Design of a Novel Zero-Cross Detection Circuit for Synchronous BUCK Converter, Chinese Journal of Electron Devices, vol. 37 No. 3, Jun. 2014, Institute of Microelectronics, Southwest Jiaotong University, Chengdu 610031, China.

*Primary Examiner* — Jeffrey S Zweizig
(74) *Attorney, Agent, or Firm* — LEYDIG, VOIT & MAYER, LTD.

(57) ABSTRACT

A circuit arrangement for monitoring an alternating voltage signal includes a comparator configured to receive the alternating voltage signal or a signal obtained from the alternating voltage signal at a first comparator input and output a comparator signal at a comparator output. The circuit arrangement further includes a zero crossing detector configured to receive a reference signal or a signal obtained from the reference signal at a monitoring input and generate a detector signal at an output of the zero crossing detector. The circuit arrangement further includes a logic circuit including a first timing element connected downstream of the zero crossing detector for generating a first clock signal and a second timing element connected downstream of the zero crossing detector for generating a second clock signal.

10 Claims, 13 Drawing Sheets

(51) Int. Cl.
    *G01R 19/175*     (2006.01)
    *H03K 5/1536*     (2006.01)
    *H03K 19/21*     (2006.01)

(56) References Cited

U.S. PATENT DOCUMENTS

| | | |
|---|---|---|
| 11,402,411 B2 * | 8/2022 | Cuica .................... G05B 19/05 |
| 2007/0285291 A1 | 12/2007 | Makino et al. |
| 2020/0191838 A1 | 6/2020 | Culca |
| 2020/0393499 A1 | 12/2020 | Culca |

FOREIGN PATENT DOCUMENTS

| | | |
|---|---|---|
| CN | 207765960 U | 8/2018 |
| DE | 102007011121 A1 | 9/2007 |
| DE | 102017116534 A1 | 1/2019 |
| DE | 102017127070 A1 | 5/2019 |
| EP | 0935758 B1 | 5/2001 |
| JP | 2001133489 A | 5/2001 |

* cited by examiner

| Input 1 | Input 2 | Output |
|---------|---------|--------|
| 0 | 0 | 0 |
| 1 | 0 | 1 |
| 0 | 1 | 1 |
| 1 | 1 | 0 |

FIG. 11

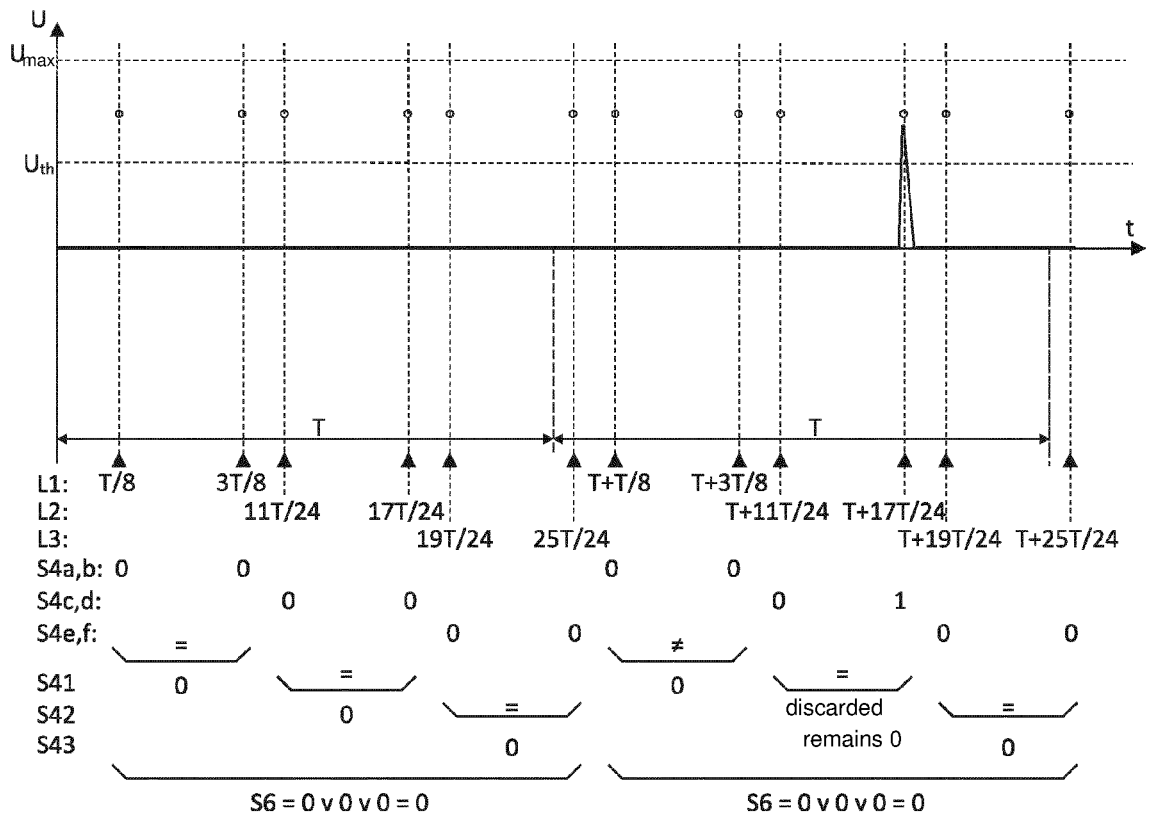

FIG. 12

| Initialization: |  |  |
|---|---|---|
| - Recognize whether there are interruptions from S2 (AC operation) | | |
| - Measure the time interval between two interruptions, determine T | | |
| - Calculate the values T/4, T/8 | | |
| Cyclical method: | | |
| Time | Interruption by | Action |
| 0 | S2 | Start timing element with T/8 |
| T/8 | Timing element | Start timing element with T/4 |
|  |  | Capture comparator signal S1 to S4a |
| 3T/8 | Timing element | Capture comparator signal S1 to S4b |
|  |  | Calculate S4: if S3a = S3b, S41 = S3b, otherwise keep previous value |

FIG. 13

| \ | \ | \ |
|---|---|---|
| Initialization: <br> - Recognize whether interruptions come from S2 (AC operation) <br> - Measure the time interval between two interruptions, determine T <br> - Calculate the values T/4, T/8, T/12 | | |
| Cyclical method: | | |
| Time | Interruption by | Action |
| 0 | S2 | Start timing element 1 with T/8 |
| T/8 | Timing element 1 | Start timing element 2 with T/4 <br> Capture comparator signal S1 to S4a |
| 3T/8 | Timing element 2 | Start timing element 2 with T/12 <br> Capture comparator signal S1 to S4b <br> Calculate S41: if S4a = S4b, S41 = S4b, otherwise keep previous value |
| 11T/24 | Timing element 2 | Start timing element 2 with T/4 <br> Capture comparator signal S1 to S4c |
| 17T/24 | Timing element 2 | Start timing element 2 with T/12 <br> Capture comparator signal 1 to S4d <br> Calculate S42: if S4c = S4d, S42 = S4d, otherwise keep previous value |
| 19T/24 | Timing element 2 | Start timer 2 with T/4 <br> Capture comparator signal S1 to S4e |
| T | S2 | Start timing element 1 with T/8 - new cycle |
| 25T/24 (T + T/24) | Timing element 2 | Capture comparator signal 1 to S4f <br> Calculate S43: if S4e = S4f, S43 = S4e, otherwise keep previous value <br> Calculate S6 = S41 v S42 v S43 <br> ("Rest cycle" - ends before the interruption from S2 comes) |

FIG. 14

| | | |
|---|---|---|
| Initialization:<br>- Recognize whether interruptions come from S2 (AC operation)<br>- Measure the time interval between two interruptions, determine T<br>- Calculate the values T/4, T/12, T/24<br>- Initialization S4e = 0 | | |

Cyclical method:

| Time | Interruption from | Action |
|---|---|---|
| 0 | S2 | Start timing element with T/24 |
| T/24 | Timing element | Start timing element with T/12<br>Capture comparator signal S1 to S4f<br>Calculate S43: if S4e = S4f, S43 = S4e, otherwise keep previous value<br>Calculate S6 = S41 v S42 v S43 |
| T/8 | Timing element | Start timing element with T/4<br>Capture comparator signal S1 to S4a |
| 3T/8 | Timing element | Start timing element with T/12 Capture comparator signal S1 to S4b Calculate S41: if S4a = S4b, S41 = S4b, otherwise keep previous value |
| 11 T/24 | Timing element | Start timing element with T/4<br>Capture comparator signal S1 to S4c |
| 17T/24 | Timing element | Start timing element with T/12<br>Capture comparator signal 1 to S4d<br>Calculate S42: if S4c = S4d, S42 = S4d, otherwise keep previous value |
| 19T/24 | Timing element | Capture comparator signal S1 to S4e |

CIRCUIT ARRANGEMENT AND METHOD FOR MONITORING A SIGNAL FORMED BY ALTERNATING VOLTAGE

CROSS-REFERENCE TO PRIOR APPLICATIONS

This application is a U.S. National Phase application under 35 U.S.C. § 371 of International Application No. PCT/EP2020/057260, filed on Mar. 17, 2020, and claims benefit to German Patent Application No. DE 10 2019 107 641.2, filed on Mar. 25, 2019. The International Application was published in German on Oct. 1, 2020 as WO 2020/193282 under PCT Article 21(2).

FIELD

The present invention relates to a circuit arrangement and a method for monitoring an alternating voltage signal.

BACKGROUND

Electronic devices such as programmable logic controllers or programmable logic relays are subjected to a series of electromagnetic compatibility (EMC) tests, as required in product standards or in the EMC generic standards, EN 61000-6-1.4. In order to pass these tests without errors or with acceptable deviations, different interference suppression measures are usually sensible, mostly electrical filters but also filter processes in the device firmware.

The interference is mostly high-frequency and can be attenuated with filters in a higher frequency range, resulting in no unacceptable signal delays e.g. for device inputs of the above-mentioned type. An exception to this is the surge voltage. It concerns high-energy overvoltage pulses that are generated by switching operations or lightning strikes in the supply network. These not only have a destructive potential, but can also impermissibly falsify the status of an input. In the industrial environment, the surge voltage for device inputs is 1,000 Volts (V), and even up to 2,000 V in the near future (EN 61000-6-2 standard update). The pulse shape (according to the basic standard EN 61000-4-5) is virtually triangular with a steep entry time (front time) of 1.2 microseconds (µs) and a duration of 50 µs, but this denotes a "halving time" in which the voltage reaches half the amplitude. The voltage then continues to decrease until it reaches the value 0 V at approximately 100 µs; an overshoot into the opposite polarity up to 30% of the amplitude can also follow. Further oscillations in internal circuits in the device are possible, so that in practice the interference can be expected to last for several hundred microseconds. In order to efficiently eliminate this interference, for example, relatively low-frequency filters with a time constant in the range from several hundred microseconds up to one millisecond can be used. The resulting delay would be too high for fast inputs.

Documents EP 0935758 B1 and DE 102017116534 A1 describe various circuit arrangements.

Document U.S. Pat. No. 3,611,162 A relates to an arrangement for detecting abnormal conditions of alternating voltage sources. The arrangement comprises a first and a second Schmitt trigger circuit which react to two values of a rectified voltage of a source voltage, a first and a second monostable circuit connected downstream, a flip-flop and a logic gate. The first monostable circuit is connected on the output side to a reset input of the flip-flop, and the second monostable circuit is connected on the output side to an input of the logic gate.

Document U.S. Pat. No. 6,255,864 B1 describes a circuit arrangement for monitoring a defined amplitude threshold value of alternating voltage input signals. The circuit arrangement comprises a series connection with a rectifier, a step-down converter and a comparator as well as a zero crossing detector, a delay stage connected downstream of the zero crossing detector and flip-flop. A comparator output and an output of the delay stage are connected to inputs of the flip-flop in such a way that a signal having a different state is generated at the output of the flip-flop.

SUMMARY

In an embodiment, the present invention provides a circuit arrangement for monitoring an alternating voltage signal. The circuit arrangement comprises: a comparator configured to receive the alternating voltage signal or a signal obtained from the alternating voltage signal at a first comparator input and output a comparator signal at a comparator output as a function of a comparison of the alternating voltage signal or output the signal obtained therefrom with a defined threshold value, a zero crossing detector configured to receive a reference signal or a signal obtained from the reference signal at a monitoring input and generate a detector signal at an output of the zero crossing detector, and a logic circuit, wherein the reference signal is an alternating voltage signal and the reference signal and the alternating voltage signal have the same frequency, wherein the logic circuit comprises: a first timing element connected downstream of the zero crossing detector for generating a first clock signal as a function of the detector signal, a second timing element connected downstream of the zero crossing detector for generating a second clock signal as a function of the detector signal or as a function of the first clock signal, a first and a second flip-flop, and an exclusive-OR gate, wherein an output of the comparator is coupled to a data input of the first flip-flop and the second flip-flop, wherein an output of the first timing element is coupled to a clock input of the first flip-flop and an output of the second timing element is coupled to a clock input of the second flip-flop, wherein an output of the first flip-flop and an output of the second flip-flop are coupled to inputs of the exclusive-OR gate, wherein the exclusive-OR gate is configured to generate a first processing signal, wherein the logic circuit is configured to sample the comparator signal at at least two predefined times and to generate the first processing signal with a first value if the comparator signal has different values at two particular times of the at least two predefined times, and to generate a second value if the comparator signal has the same value at the two particular times, and wherein the two particular times of the at least two predefined times have the following values: $T/4-\Delta t$ and $T/4+\Delta t$, where $T$ is a period duration of the alternating voltage signal to be monitored and $\Delta t$ is a time period of less than $T/4$.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIGS. 7 to 11 show an additional example of a circuit arrangement and signals of the circuit arrangement, FIGS. 12 to 14 show examples of methods using the circuit arrangement.

DETAILED DESCRIPTION

Figure 1A:
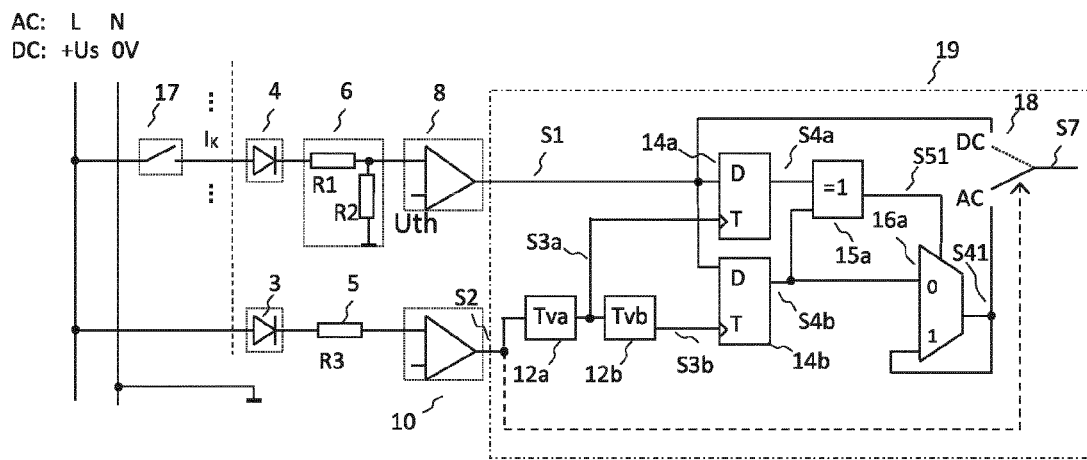
FIGS. 1A and 1B and 2 to 4 show examples of a circuit arrangement and signals of the circuit arrangement.

In an embodiment, the present invention provides a circuit arrangement and a method for monitoring an alternating voltage signal by which the influence of interference can be reduced.

In one embodiment, a circuit arrangement for monitoring an alternating voltage signal comprises a comparator to which the alternating voltage signal or a signal obtained therefrom can be fed at a first comparator input. The comparator is configured to output a comparator signal at a comparator output as a function of a comparison of the alternating voltage signal or the signal obtained therefrom with a defined threshold value. The circuit arrangement comprises a zero crossing detector to which a reference signal or a signal obtained therefrom can be fed to a monitoring input. The zero crossing detector is configured to generate a detector signal at an output of the zero crossing detector. The circuit arrangement further comprises a logic circuit which is coupled on the input side with the comparator output and with the output of the zero crossing detector. The logic circuit is configured to sample the comparator signal at at least two predefined times and to generate a first processing signal with a first value if the comparator signal has different values at two particular times of the at least two predefined times, and to generate a second value if the comparator signal has the same value at the two particular times.

The comparator signal is advantageously sampled at two particular times. If there is interference, the comparator signal has different values. This is signaled by the second value of the first processing signal. In this case the logic circuit can ignore the different values of the comparator signal, for example.

In one embodiment, the logic circuit generates a first output signal at the second value of the first processing signal, which has the value of the comparator signal sampled at the two particular times, and maintains the previous value of the first output signal at the first value of the first processing signal.

In one embodiment, in the case of a single-phase circuit arrangement, the first output signal can be used as an alternating voltage status signal.

In one embodiment, the two particular times of the at least two predefined times are in exactly one period of the alternating voltage signal to be monitored. The method is repeated, for example in the next, the next but one or the n-th period.

In an alternative embodiment, the first time of the two particular times is in a first period and the second time of the two particular times is in a second period of the alternating voltage signal to be monitored.

In one embodiment, the two particular times of the at least two predefined times are selected such that they have the following values:

$T/4-\Delta t$ and $T/4+\Delta t$, where T is a period duration of the alternating voltage signal to be monitored and $\Delta t$ is a time period of less than T/4. A sinusoidal signal (with the value 0 at t=0 and the period duration T) has the same value at the two particular times $T/4-\Delta t$ and $T/4+\Delta t$. For example, $\Delta t=T/8$ and thus the two particular times are T/8 and T·3/8. At the two particular times T/8 and T·3/8, the value of the sinusoidal signal advantageously corresponds to the root mean square of the sinusoidal signal.

In one embodiment, the logic circuit generates a second processing signal with a first value if the comparator signal has different values at two further particular times of the at least two predefined times, and with a second value if the comparator signal has the same value at the two further particular times.

In one embodiment, the two particular times and the two further particular times of the at least two predefined times are in the same period of the alternating voltage signal to be monitored. The four particular values can be different from each other.

In one embodiment, the two further particular times of the at least two predefined times are selected such that they have the following values:

$T\cdot 7/12-\Delta t$ and $T\cdot 7/12+\Delta t$.

In one embodiment, the logic circuit generates a third processing signal with a first value if the comparator signal has different values at two additional particular times of the at least two predefined times, and with a second value if the comparator signal has the same value at the two additional particular times.

In one embodiment, the two additional particular times, the two further particular times and the two particular times of the at least two predefined times are in the same period or in two successive periods of the alternating voltage signal to be monitored. The six determined values can be different from each other.

In one embodiment, the two additional particular times of the at least two predefined times are selected such that they have the following values:

$T\cdot 11/12-\Delta t$ and $T\cdot 11/12+\Delta t$ or $\Delta t-T/12$ and $T\cdot 11/12-\Delta t$.

The first, second and third processing signals are determined when the value of the time period $\Delta t$ is identical.

In one embodiment, the logic circuit generates, at the second value of the second processing signal, a second output signal which has the value of the comparator signal sampled at the two further particular times, and at the first value of the second processing signal the logic circuit maintains the previous value of the second output signal.

In one embodiment, the logic circuit generates, at the second value of the third processing signal, a third output signal which has the value of the value of the comparator signal sampled at the two additional particular times, and at the first value of the third processing signal the logic circuit maintains the previous value of the third output signal.

In one embodiment, the logic circuit generates the alternating voltage status signal by OR-linking of the first, second and third output signals.

In one embodiment, the logic circuit is implemented as a microcontroller or microprocessor.

In one embodiment, the logic circuit comprises a first timing element connected downstream of the zero crossing detector for generating a first clock signal as a function of the detector signal, a second timing element connected downstream of the zero crossing detector for generating a second clock signal as a function of the detector signal or as a function of the first clock signal, a first and a second flip-flop and an exclusive-OR gate.

An output of the comparator can be coupled to a data input of the first flip-flop and the second flip-flop. An output of the first timing element can be coupled to a clock input of the first flip-flop. An output of the second timing element can be coupled to a clock input of the second flip-flop. An output of the first flip-flop and an output of the second flip-flop can be coupled to inputs of the exclusive-OR gate. The exclusive-OR gate generates the first processing signal.

In one embodiment, the second timing element is connected downstream of the first timing element and is triggered by the first clock signal to generate the second clock signal.

In one embodiment the logic circuit comprises a multiplexer. The multiplexer comprises a first input which is coupled to the output of the first or the second flip-flop, a second input, a control input which is coupled to an output of the exclusive-OR gate, and an output which is coupled to the second input and at which the first output signal is emitted.

In one embodiment, the multiplexer, the exclusive-OR gate, the flip-flops and/or the timing elements are implemented by software within a microcontroller or microprocessor.

In one embodiment, a method for monitoring an alternating voltage signal comprises:
  capturing the alternating voltage signal,
  generating a comparator signal as a function of a comparison of the alternating voltage signal or the signal obtained therefrom with a defined threshold value,
  generating a detector signal by a zero crossing detector to which a reference signal or a signal obtained therefrom is supplied, and
  sampling the comparator signal at at least two predefined times and generating a first processing signal with a first value if the comparator signal has different values at two particular times of the at least two predefined times, and with a second value if the comparator signal has the same value at the two particular times.

In one embodiment, the reference signal has the form of an alternating voltage signal (e.g., an alternating current (AC) signal). The reference signal and the alternating voltage signal have the same frequency. The reference signal can be sinusoidal. The alternating voltage signal can be sinusoidal.

In one embodiment, a software product is configured to be executed within a microcontroller or microprocessor. When it is executed, the software product carries out a method as described above.

In one embodiment, the circuit arrangement and the method for monitoring and interference suppression of sinusoidal alternating voltage signals are implemented.

The method for monitoring an alternating voltage signal can be implemented, for example, by the circuit arrangement according to any of the embodiments defined above and with the steps described above.

In one embodiment, for a direct current (DC) supply and DC signals, the method explained above can be bypassed via a switch. The comparator signal is output directly at an output of the circuit arrangement.

In one embodiment, the combination of alternating current (AC)/DC devices in one device means that the inputs are also fast for AC operation. The circuit arrangement and the method described above avoid problems in the surge test (falsification of the inputs). With this method, the interference in the firmware can be filtered while taking into account/adapting various AC capturing methods. The method serves to suppress interference from the AC inputs so that the devices pass a surge test.

In one embodiment, the monitoring and interference suppression for devices with DC supply and DC inputs, e.g. 24V DC, can be implemented in the firmware. Because this type of interference is a one-time event, i.e. a second interference pulse comes only after a long time, the input is captured twice at an interval of, for example, 1 millisecond (ms). These values are compared with each other and ignored if they do not match, the previous value being maintained. Since the interference can only falsify one of the two captures, the interference is thereby eliminated. This type of interference suppression is particularly useful if the same inputs can be used both as fast inputs and as standard inputs, so that hardware filtering is not possible. As fast inputs, they are protected against interference by other measures, e.g. by the use of shorter, shielded cables, and are not interference-suppressed in the firmware.

In one embodiment, with AC devices that have relatively fast AC inputs, such a delay can also lead to significant distortion of the signal, which would result in some falsification of the input switching level, but which is usually still acceptable. However, modern universal devices that can be operated with both DC and AC supply voltage and inputs have the additional requirement that the inputs should generally be fast for DC operation, which also applies to AC operation (same circuit), so that sufficient hardware filtering is not possible. In this case, reading twice at an interval of 1 ms (as in DC operation) would not be an optimal solution, because during this time the voltage reaches a different level and difficulties would be encountered in maintaining the switchover level, especially for combined AC/DC devices in which the level has to be adhered to relatively precisely.

In one embodiment, the circuit arrangement and the method disclosed here allow the AC inputs to be read while strictly adhering to the switchover level, and at the same time enable surge voltage pulses to be filtered for both "single-phase" capture—in which the inputs are wired in the same phase as the supply voltage—and also for "three-phase" capture—in which the inputs can be wired with any phase.

Single-Phase Method:

FIG. 1A shows an example of the circuit arrangement for detecting and suppressing interference of single-phase AC inputs. The circuit on the input side comprises a zero crossing detector 10 with a comparator, a rectifier 3 and a current limiting resistor 5 as well as circuits for the inputs, in this case by way of example for an alternating voltage signal Ik (also called input, input signal, alternating voltage signal or AC input signal) with a rectifier 4, a voltage divider 6 and a comparator 8. The output signals are in each case a comparator signal S1 and a detector signal S2. The logic circuit 19 (also called a logic block) comprises two timing elements 12a, 12b with the delay times Tva and TVb, two flip-flops 14a, 14b (e.g. implemented as bistable multivibrators), an exclusive OR gate 15a (also designated as XOR gate or exclusive OR), a multiplexer 16a and a controlled changeover switch 18 (also called a selector switch) between AC and DC operation.

The circuit arrangement is designed to process an AC input signal (sinusoidal alternating voltage signal) and a DC input signal (direct voltage signal). In this example, the AC input signal comes from a phase L of a supply network. The DC input signal comes from a DC source +Us. N or 0V denotes the neutral conductor (for AC) or the reference potential (for DC). The circuit arrangement is used, for example, in a programmable logic controller or a logic relay, or the like. The detector signal S2, which can also be referred to as the zero crossing signal, is generated from the phase L of the device by the zero crossing detector 10. The zero crossing detector 10 is constructed in the form of a comparator which compares the supply voltage with a ground potential GND (zero reference) or an approximate ground potential. In this way, the type of voltage signal applied to the phase L can be detected. If an AC input signal is present, the zero crossing detector 10 detects zero crossings and thus recognizes the applied AC input signal. In this case, the zero crossing detector 10 generates the detector signal S2. The detector signal S2 then in turn triggers the timing element 12a, which generates the clock signal S3a. If, on the other hand, a DC input signal is applied, the zero crossing detector 10 does not detect any zero crossings. In this case, the zero crossing detector 10 does not generate the detector signal S2. The timing element 12a is also not triggered in this case and also does not generate the clock signal S3a.

The supply voltage (input signal) at the phase L is first rectified before it is fed into the zero crossing detector 10. This is illustrated schematically in FIG. 1A in the form of the diode 3. A resistor 5 with the value R3 can be arranged between the diode 3 and the zero crossing detector 10. The diode 3 carries out, for example, a half-wave rectification, so that the detector signal S2 can be generated from the signal obtained by the zero crossing detector 10. The zero crossing detector 10 is implemented as a comparator.

In FIG. 1A, the input signal Ik is rectified by the rectifier 4, divided down by the voltage divider 6 (also called a step-down converter, in this case in the form of a simple voltage divider with two resistors R1, R2), and is compared by the comparator 8 with a predefined threshold value Uth and thus "digitized" as a comparator signal S1. The input signal Ik is a voltage signal. The rectifier has a diode 4, which can be implemented discretely. A reference voltage source specifies the threshold value Uth. The threshold value Uth can be constant, for example.

In the event that zero crossings of the input signal Ik are not detected by the zero crossing detector 10, the detector signal S2 and thus the clock signal S3a are also not generated. In this case, the changeover switch 18 remains in an upper position (DC operation). In this position of the changeover switch 18, the output of the comparator 8 (at which the signal S1 is generated) is placed directly on the output S7 of the circuit arrangement. The comparator signal S1 is thus present at the output S7. If a DC input signal is present, this can be monitored by means of the comparator 8. If the DC input signal exceeds the predefined threshold value Uth, the comparator 8 generates the comparator signal S1 and outputs this via the changeover switch 18 directly at the output S7.

In the alternative case where zero crossings of the input signal Ik are detected by the zero crossing detector 10, the detector signal S2 and thus the clock signal S3a are also generated (see explanations above). In this case, the changeover switch 18-triggered by the zero crossing detector 10 or the timing element 12a (for example via the detector signal S2, the clock signal S3 or another control signal, see dashed line in FIG. 1A)—switches to the lower position shown in FIG. 1A (AC operation). In this position of the changeover switch 18, the output of the comparator 8, i.e. the comparator signal S1, is fed to the data input D of the flip-flop 14a. The clock input Clk is controlled by the generated clock signal S3a. The components 12a, 12b, 14a, 14b, 15a, 16a and 18 are implemented in the embodiment according to FIG. 1A in a microcontroller which implements the logic circuit 19. The first comparator signal S1 is fed to an input of the microcontroller. The detector signal S2 is fed to an interrupt input of the microcontroller.

The generation and function of the clock signal S3a, S3b is explained in detail below (see FIGS. 2 to 4). It is assumed here that an AC input signal & is present and the changeover switch 18 is set in AC operation.

Starting from the detector signal S2, the timing element 12a generates the clock signal S3a as a clock for the flip-flop 14a. The clock signal S3a has a defined status change (falling clock edge, see FIG. 2), which occurs after a delay of T/8 of a period duration T after a zero crossing of the AC input signal Ik (detected by the detector signal S2). The timer 12b generates the clock signal S3b as a clock for the flip-flop 14b. The clock signal S3b has a status change (falling clock edge, see FIG. 2) which occurs after a delay of 3T/8 of a period duration T after a zero crossing of the AC input signal Ik. The root mean square of the sinusoidal AC input signal Ik is present at these times. This can be shown mathematically by the following calculation. The sinusoidal AC input signal Ik corresponds $$u(t) = U_{peak} \sin(\omega t)$$

to the peak value Upeak. If this mathematical signal description is solved as follows:

$$\omega t_x = \frac{\pi}{4} + \frac{\pi}{2} = \frac{3\pi}{4} \ bzw, \ t_x = \frac{1}{\omega} \frac{3\pi}{4} = \frac{T}{2\pi} \frac{3\pi}{4} = 3\frac{T}{8}.$$

wherein Upeak=√2 Urms and Urms corresponds to the root mean square, the following relationship is obtained for the desired instant tx at which the root mean square Urms is present:

$$\omega t = \arcsin\left(\frac{u(t)}{\sqrt{2} \ U_{rms}}\right)$$

Since $$\omega t_x = \arcsin\left(\frac{u(t_x)}{\sqrt{2} \ U_{rms}}\right) = \arcsin\left(\frac{U_{rms}}{\sqrt{2} \ U_{rms}}\right) = \arcsin\left(\frac{1}{\sqrt{2}}\right) = \frac{\pi}{4} \ bzw.$$

$$t_x = \frac{1}{\omega} \frac{\pi}{4} = \frac{T}{2\pi} \frac{\pi}{4} = \frac{T}{8}.$$

the following is obtained for the second possible time tx:

$$\sin(\omega t) = \sin\left(\omega t + \frac{\pi}{2}\right),$$

Thus, at the times T/8 and 3T/8 of a period duration T after a zero crossing of the AC input signal Ik, the root mean square of the AC input signal Ik is present in each case.

The clock signal S3a triggers the flip-flop 14a at its edge-controlled input Clk, wherein the value of the comparator signal S1 at the data input D of the flip-flop 14a is accepted at the relevant time of a corresponding status change (falling clock edge) of the clock signal S3a (at T/8)

and thus a first status signal S4a is generated at the output of flip-flop 14a. Alternatively, with a suitable design of the clock signal S3a and the flip-flop 14a, a rising clock edge may also be used instead of a falling clock edge.

Correspondingly, the clock signal S3b triggers the flip-flop 14b at its edge-controlled input Clk, wherein the value of the comparator signal S1 at the data input D of the flip-flop 14b is adopted at the relevant time of a corresponding status change (falling clock edge) of the clock signal S3a (at 3T/8) and thus a second status signal S4b is generated at the output of the flip-flop 14b.

Finally, an alternating voltage status signal is provided at the output S7 and can be processed further, for example by a logic circuit of the electronic device in which the circuit arrangement is used.

If the input signal Ik is equal to zero (switch 17 open), the comparator signal S1 of the comparator 8 is always "0" and the value "0" is stored in the flip-flops 14a, 14b every time. If there is a valid input signal Ik which exceeds the comparison threshold (threshold value Uth) of the comparator 8, the comparator signal S1 has a pulse. In the case of a sinusoidal AC input signal Ik, the pulse of the comparator signal S1 is centered around the vertex of the input signal Ik, the width of which depends on the actual amplitude of the AC input signal Ik, i.e. the higher the amplitude, the wider the pulse of the comparator signal S1. The AC input signal Ik can be evaluated with regard to its root mean square by evaluating the comparator signal S1 in the flip-flops 14a, 14b at the times T/8 and 3T/8, triggered by the clock signals S3a, S3b of the timing elements 12a, 12b.

Figure 1B:
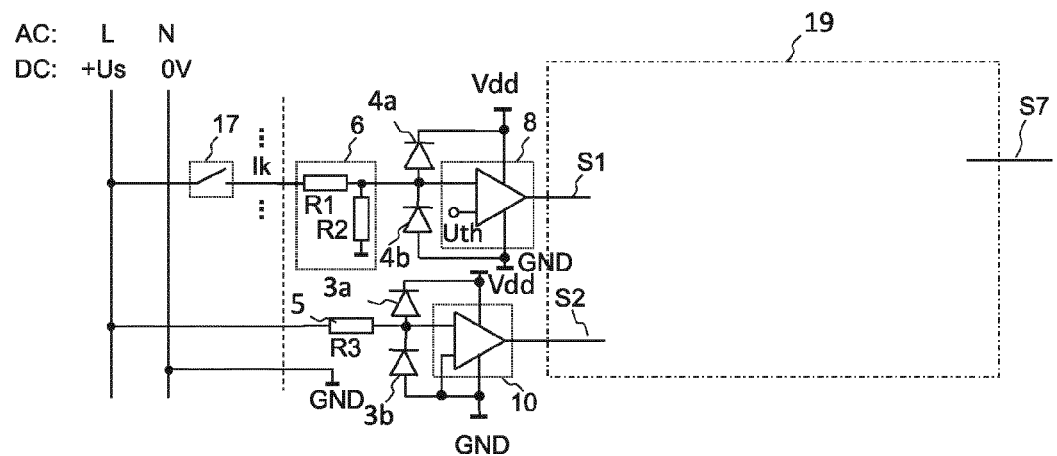

FIG. 1B shows an alternative example of the circuit arrangement which is a further development of the example shown in FIG. 1A. In contrast to FIG. 1A, an applied input signal Ik is first fed to the step-down converter 6 in FIG. 1B. The output signal of the step-down converter 6 is rectified by a first and a second diode 4a, 4b. The first diode 4a connects the input of the comparator 8 to a supply voltage connection. A supply voltage Vdd is applied to the supply voltage connection. The first diode 4a is polarized such that a voltage across the input of the comparator 8 is less than the supply voltage Vdd (if necessary, plus a threshold voltage of the first diode 4a). The second diode 4b connects the input of the comparator 8 to a ground potential connection at which the ground potential GND is present. The second diode 4b is polarized in such a way that the voltage across the input of the comparator 8 is greater than the ground potential GND (if necessary, minus a threshold voltage of the second diode 4b).

The comparator 8 can be implemented as a bipolar comparator. The comparator 8 generates the first output signal S1 depending on a comparison of the voltage across the input of the comparator 8 and the threshold value Uth. The comparator signal S1 is pulsed. The pulse of the comparator signal S1 is timed by the logic circuit 19, as indicated in FIG. 1a.

Alternatively, the comparator 8 can be implemented as an inverter. The diodes 4a, 4b can, for example, be integrated in the inverter. The diodes 4a, 4b can be implemented as protective diodes. The inverter has a "built-in" threshold value A. The first and the second diode 4a, 4b can optionally be integrated together with the inverter on a semiconductor body (for example, a complementary metal-oxide semiconductor (CMOS) inverter of the HC04 type).

For the detector signal S2 to be generated by the zero crossing detector 10, in the example according to FIG. 1B an applied input signal Ik is first fed to the resistor 5 with the value R3 and then rectified by a first and a second diode 3a, 3b. The first diode 3a connects the input of the zero crossing detector 10 to the supply voltage connection. The first diode 3a is polarized in such a way that a voltage across the input of the zero crossing detector 10 is less than the supply voltage Vdd (if necessary, plus a threshold voltage of the first diode 3a). The second diode 3b connects the input of the zero crossing detector 10 to the ground potential connection. The second diode 3b is polarized in such a way that the voltage across the input of the zero crossing detector 10 is greater than the ground potential GND (if necessary, minus a threshold voltage of the second diode 3b). The detector signal S2 is pulsed.

The zero crossing detector 10 can be implemented as a bipolar comparator.

Alternatively, the zero crossing detector 10 can be implemented as an inverter. The diodes 3a, 3b can be integrated, for example, in the inverter. The diodes 3a, 3b can be implemented as protective diodes. The zero crossing detector 10 has a "built-in" threshold value. Since the voltage supplied to the zero crossing detector 10 is not divided down, the voltage rise is rapid. The time offset between the zero crossing of the supplied voltage and the switching of the zero crossing detector 10 is very small and can be disregarded.

The threshold value of the zero crossing detector 10 can be 0 V (i.e. the ground potential, as in FIG. 1B) or a voltage different from 0 V, for example a small positive voltage (for example 2 V).

In alternative embodiments, the comparator 8 and/or the zero crossing detector 10 can be implemented as a CMOS gate, for example a CMOS gate of the HC type, or as a transistor. In the case of the transistor, the threshold value A can be, for example, the base-emitter voltage above which a current flows through the transistor (for example Ube=approx. 0.65 V). The resistance values of the resistors R1, R2 of the step-down converter 6 are then dimensioned accordingly. Then only the second diodes 4b and 3b can be provided. The first diodes 4a and 3a can be omitted.

The comparator 8 can be produced as a component to which the diodes 4a, 4b are externally connected upstream as protective diodes, or as a component with integrated diodes 4a, 4b (such as a CMOS inverter with protective diodes such as HC04).

The zero crossing detector 10 can be produced as a component to which the diodes 3a, 3b are externally connected upstream as protective diodes or as a component with integrated diodes 3a, 3b (such as, for example, a CMOS inverter with protective diodes such as HC04). The protective diodes can be protective diodes against electrostatic charge, abbreviated to ESD protective diodes.

The preprocessing (rectification, step-down) is only shown by way of example in FIGS. 1A and 1B and can also be implemented with alternative circuits. If necessary, rectification can be omitted. The preprocessing is designed to protect the comparator 8 and/or the zero crossing detector 10 against overvoltage and undervoltage. This function can optionally also be performed by a rectifier diode 3b, 4b for negative undervoltages. If necessary, additional protection against overvoltage can be provided.

Figure 5:
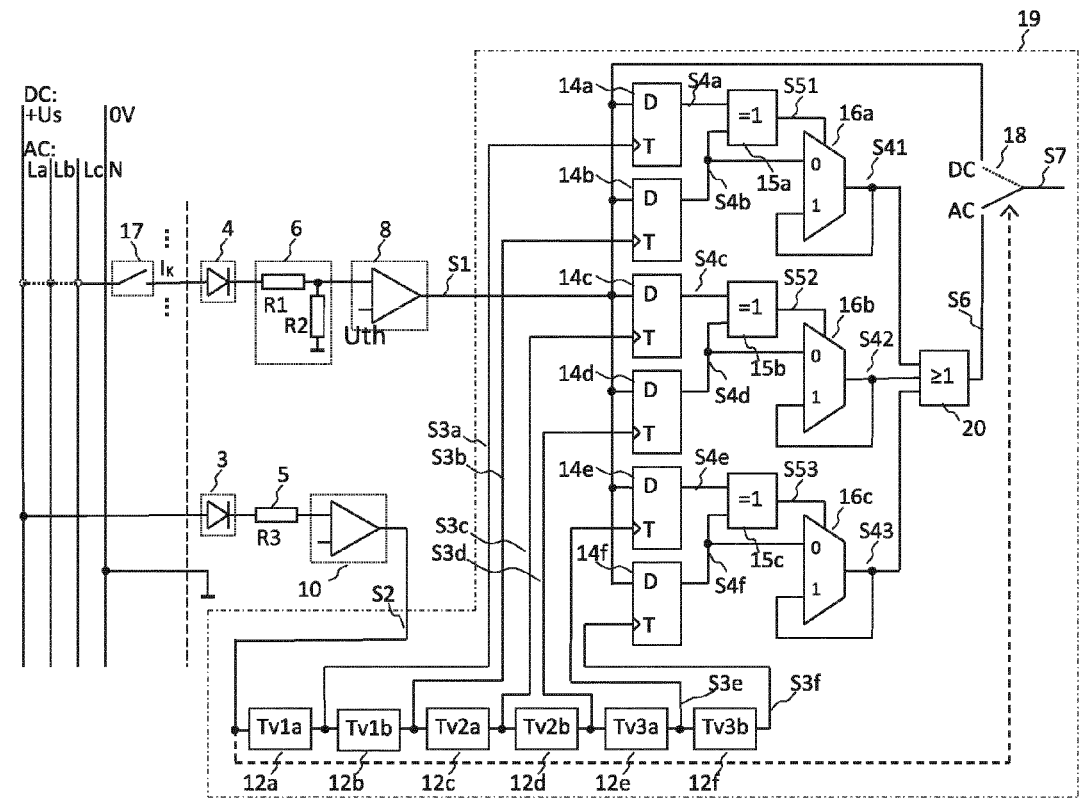
FIGS. 5 and 6 show a further example of a circuit arrangement and signals of the circuit arrangement.
Figure 7:
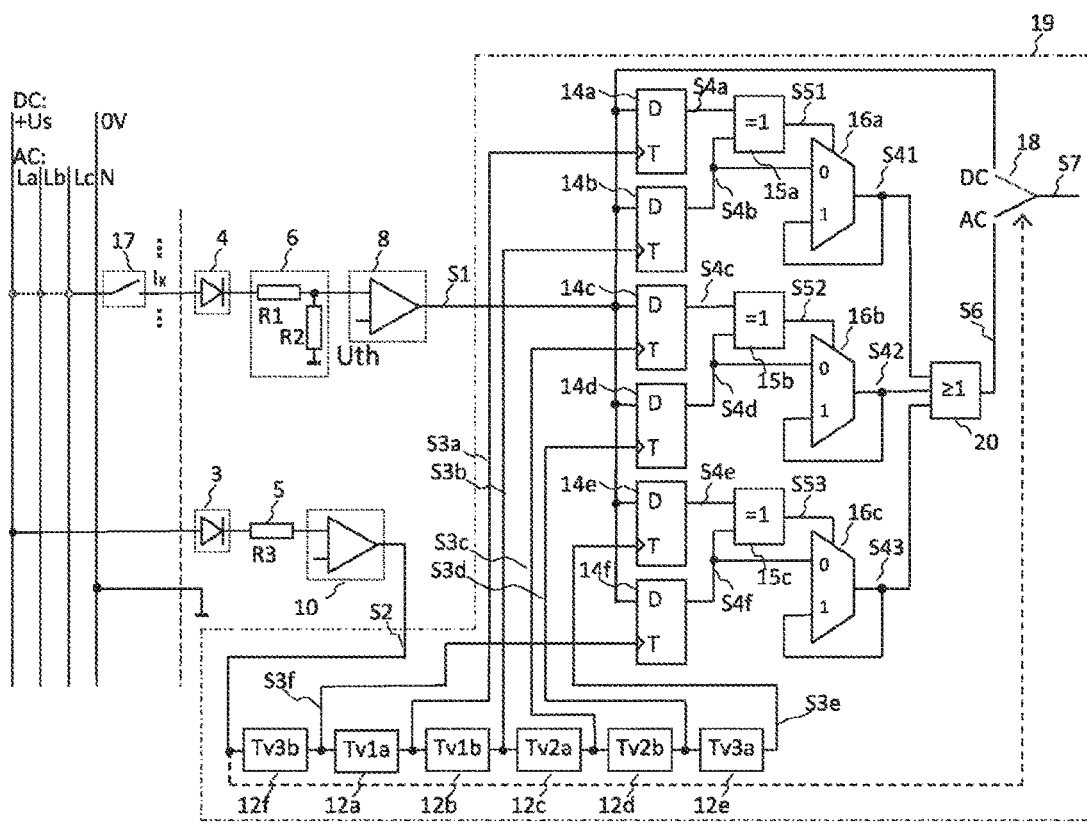
Figure 15A:
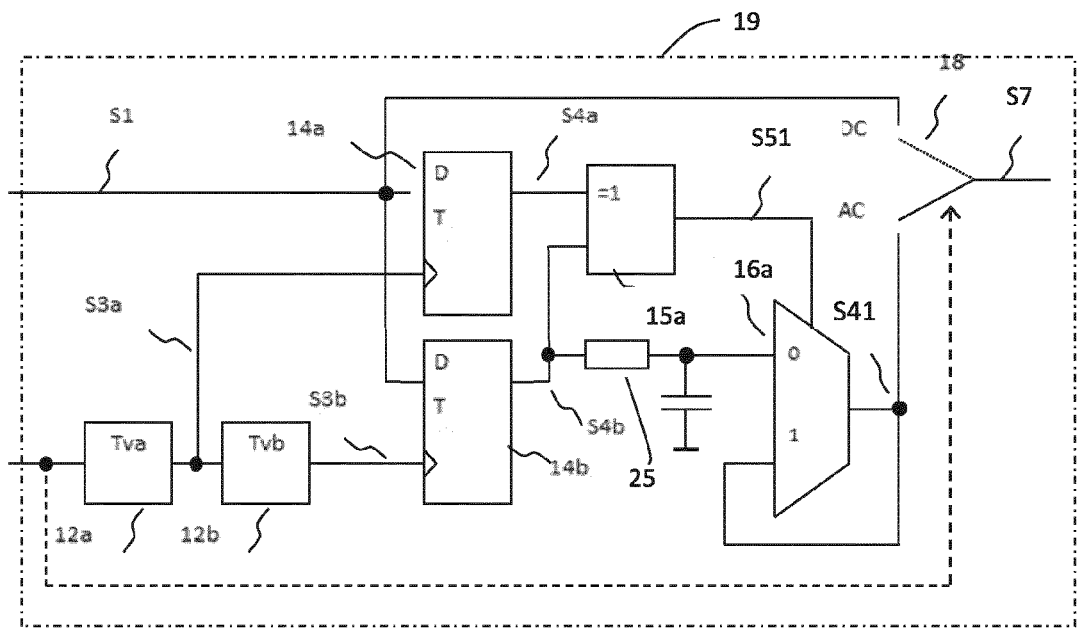
FIG. 15A to 15C show an example of a detail of the circuit arrangement and signals of the circuit arrangement.

The circuit shown in FIG. 1B can also be combined with the logic circuits 19 shown in FIGS. 5, 7 and 15A.

Figures 1C, 2:
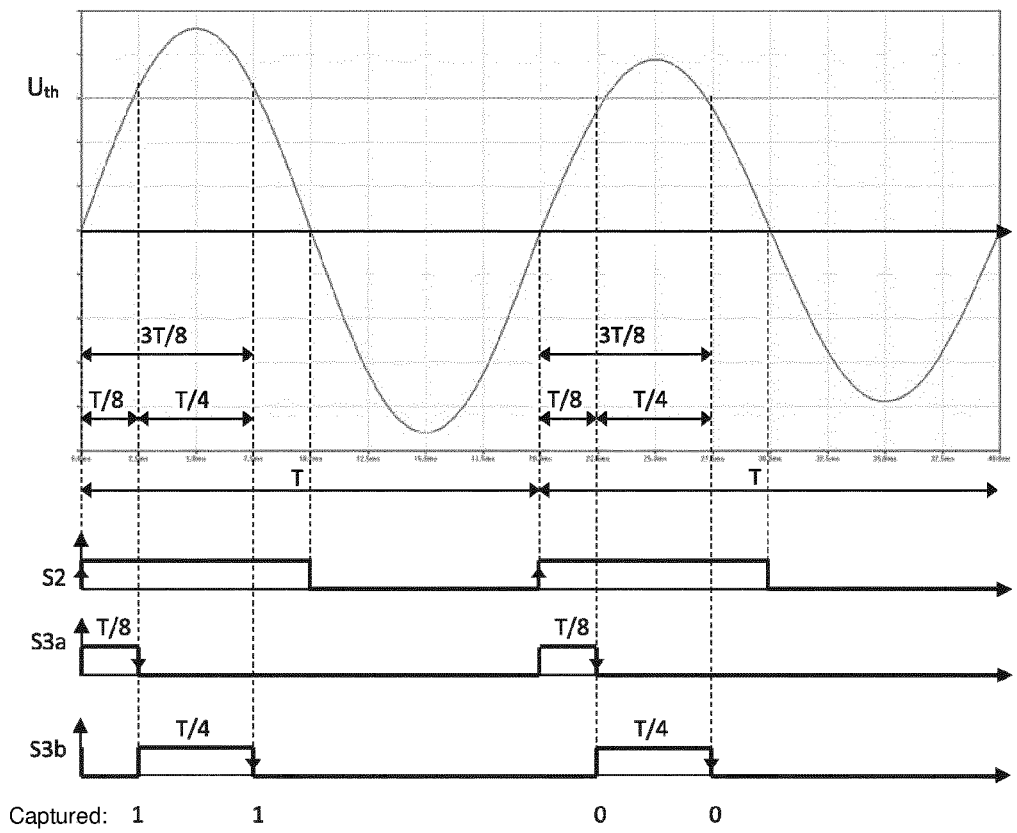
FIG. 1C shows the truth table of the exclusive OR gate of the circuit arrangement of FIG. 1A.

In FIG. 1C, the truth table of the exclusive OR gate 15a, i.e. the function XOR, is shown. If both input signals are identical, 00 or 11, the output signal is 0; if the input signals are different, 01 or 10, the output signal is 1.

FIG. 2 shows the sinusoidal input signal. The two capture times during the positive half-wave at which the signal has the same amplitude are T/8 (or 45°, or π/4) and 3T/8 (or 135°, or 3π/4). The signal is captured at both times. Normally the values are either both at 1 or both at 0, depending on the amplitude of the input signal Ik, as in the first or second period T in FIG. 2.

With the first edge (e.g. the positive one in FIG. 2) the detector signal S2, also called the zero crossing signal, triggers the first timing element 12a, which generates a pulse S3a with the duration T/8. With the second edge (for example the negative edge in FIG. 2), this pulse stores the comparator signal S1, which represents the digitized input signal, in the flip-flop 14a and at the same time triggers the second timing element 12b. This generates a further pulse S3b with the duration T/4, which then stores the comparator signal S1 in the flip-flop 14b with the second edge, namely at the time T/8+T/4=3T/8. The stored status signals S4a, S4b of the flip-flops 14a, 14b are compared with one another by the XOR gate 15a.

Normally, both status signals S4a, S4b are the same, either [0, 0] or [1, 1], and a first processing signal S51=0 (also called an XOR output). The first processing signal S51 controls the multiplexer 16a and for the value 0 the input "0" is switched to the first output signal S41, that is to say the first status signal S4b. If the first status signal S4a should now assume the other value, the first processing signal S51 does not become =1 until the time T/8. As a result, the multiplexer 16a switches over and at its output initially passes on the input "1" which is the previous first output signal S41, so the value is retained. If S4b with the new value of S4a also follows at the time 3T/8, as in the case of an input signal value change, then S51=0, the multiplexer 16a switches back to the input "0" and the new input value is passed on as the first output signal S41. However, if S4b remains at the old value (not equal to S4a), then there is interference, the multiplexer 16a remains on input "1" and the old value is thus retained until both status signals S4a, S4b assume the same value again.

Figure 3:
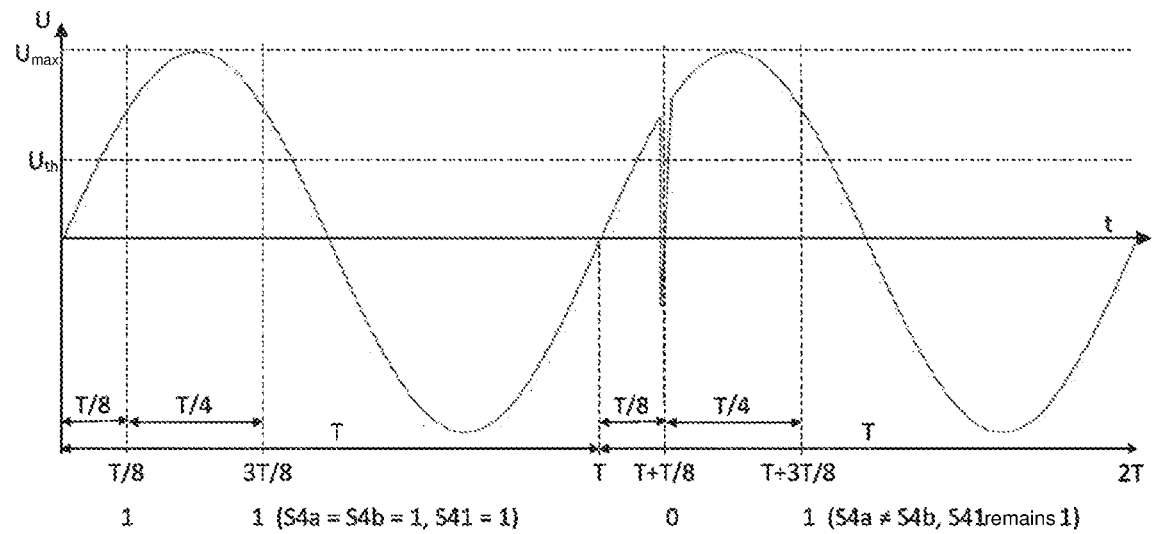

FIG. 3 shows, for example, the case with active input signal Ik=1 or "high" or uin (t)=Umax sin (ωt), which is falsified in the second period by a negative interference pulse at the time of the first capture in T/8. In the first period, both captured values are 1, S4a=S4b=1, S51=0, the multiplexer 16a is at input "0" and the first output signal S41=S4b=1. In the second period the values are not equal, S4a=0, S4b=1, the first processing signal S51=1, the multiplexer 16a is at input "1" and the first output signal S41 remains at the previous value 1. This suppresses the interference pulse. If a single capture had been implemented in T/8, the first output signal S41 and the output signal at the output S7 would be falsified. The interference suppression works in the same way if the second capture in 3T/8 is subject to interference.

Figure 4:
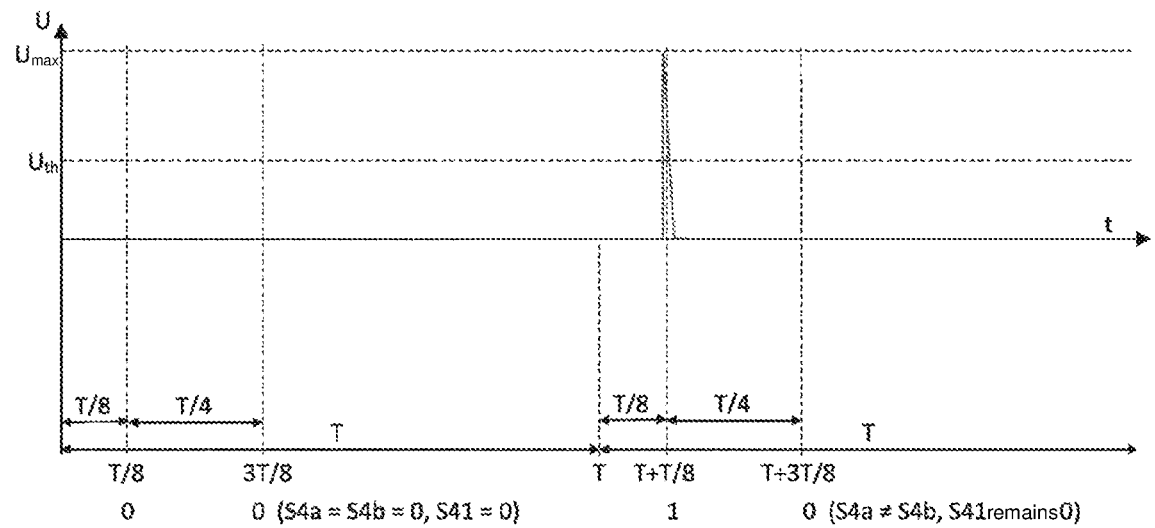

FIG. 4 shows, for example, the case with an inactive input signal Ik=0 or "low" or uin(t)=0, which is falsified in the second period by a positive interference pulse at the time of the first capture in T/8. In the first period, both captured values are 0, S4a=S4b=S51=0, the multiplexer 16a is at input "0" and the first output signal S41=S4b=0. In the second period, the values are not equal, S4a=1, S4b=0, thus S51=1, the multiplexer 16a on input "1" and the first output signal S41 remains at the previous value 0. This suppresses the interference pulse. The interference suppression works in the same way if the second capture in 3T/8 is falsified.

The disclosure primarily relates to AC operation. For universal devices that can be supplied with both AC and DC power, with the corresponding AC or DC inputs, a controllable changeover switch 18 between AC and DC operation can optionally be provided at the output of the logic circuit 19. As a result, either the comparator signal S1 for DC operation or the first output signal S41 for AC operation is switched on directly at the output S7. The control takes place by a circuit from the detector signal S2 (or one of the talk signals S3a, S3b). In the case of the AC supply, these signals are pulsed, and in the case of the DC supply, they are static. The pulses could, for example, control a retriggerable monoflop (monostable multivibrator) and thus differentiate between AC (output active) and DC (output inactive).

The logic circuit (also called a logic block) can be implemented in the firmware of a microcontroller, for example.

Three-Phase Method:

FIG. 5 shows an example of the circuit arrangement for detecting and suppressing interference of three-phase AC inputs. The circuit on the input side comprises the zero crossing detector with, for example, the rectifier 3, the current limiting resistor 5 and the comparator 10, as well as circuits for the inputs, shown here by way of example for an input signal Ik with the rectifier 4, the voltage divider 6 and the comparator 8. The output signals are in each case the comparator signal S1 and the detector signal S2. The logic block 19 comprises six timing elements "Tv1a" 12a, "TV1b" 12b, "Tv2a" 12c, "TV2b" 12d, "Tv3a" 12e, "TV3b" 12f, six flip-flops (bistable multivibrators) 14a, 14b, 14c, 14d, 14e, 14f, three XOR gates (exclusive OR) 15a, 15b, 15c, three multiplexers 16a, 16b, 16c, an OR gate 20 with three inputs and the controlled changeover switch 18 between AC and DC operation.

In order to support the mixed AC/DC operation, the input signal Ik is not captured in the vertex (T/4), but in T/8 and for interference suppression also in 3T/8 of the relevant phase.

Figure 6:
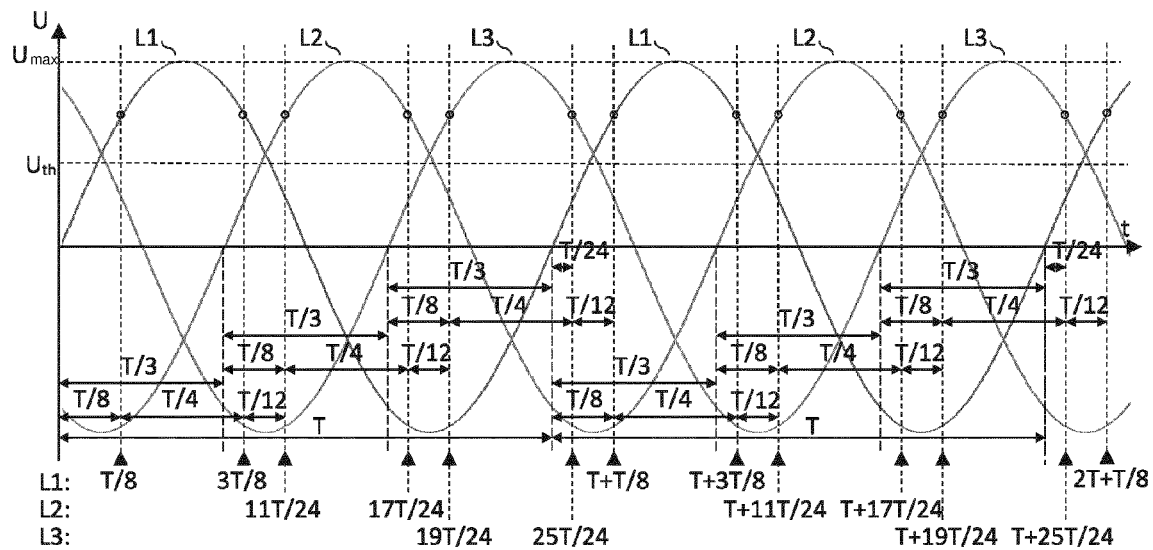

FIG. 6 shows the six capture points, two per phase. In relation to the supply phase, e.g. L1, these are:

T/8 and 3T/8 for the supply phase, e.g. L1

11T/24 and 17T/24 for the following phase e.g. L2 (T/3+T/8 and T/3+3T/8)

19T/24 and 25T/24 for the third phase e.g. L3 (2T/3+T/8 and 2T/3+3T/8)

In the case of the chain-linked timing elements, as shown in FIG. 5, the times are then:

Tv1a=T/8 (total time T/8, first capture point phase 1)

Tv1b=T/4 (total time T/8+T/4=3T/8, second capture point phase 1)

Tv2a=T/12 (total time 3T/8+T/12=11T/24, first capture point phase 2)

Tv2b=T/4 (total time 11T/24+T/4=17T/2 4, second capture point phase 2)

Tv3a=T/12 (total time 17T/24+T/12=19T/24, first capture point phase 3)

Tv3b=T/4 (total time 19T/24+T/4=2 5T/24, second capture point phase 3)

It can be seen that the evaluation of the third phase goes beyond the period 25T/24=T+T/24, so that in practice the first capture point at the beginning of a period (i.e. T/24 after zero crossing) is the second capture point of the third phase. In the arrangement shown, this means that the last timing element for T/24 runs parallel to the first timing element. For an implementation in the firmware of a microcontroller, at least two separate timers would have to be provided. If only one is available because, for example, the others are used for other tasks, the chain-linked timing elements can also be arranged differently, as shown in FIG. 7.

FIG. 7 shows an alternative example of the circuit arrangement for detecting and suppressing interference of three-phase AC inputs, which is a further development of the examples shown in FIGS. 1A, 1B and 5. Tv3b is arranged at the beginning of the chain, followed by Tv1a, Tv1b, Tv2a, Tv2b and Tv3a. The corresponding times are then:

Tv3b=T/24 (total time T/24, second capture point phase 3)

Tv1a=T/12 (total time T/24+T/12=3T/24=T/8, first capture point phase 1)

Tv1b=T/4 (total time T/8+T/4=3T/8, second capture point phase 1)

Tv2a=T/12 (total time 3T/8+T/12=11T/24, first capture point phase 2)

Tv2b=T/4 (total time 11T/24+T/4=17T/24, second capture point phase 2)

Tv3a=T/12 (total time 17T/24+T/12=19T/24, first capture point phase 3)

In this case, a single timer can be used for the firmware implementation, since, starting from the zero crossing of the supply phase (detector signal S2), none of the timers run at the same time.

Alternatively, the timing elements can also be arranged in parallel with correspondingly calculated times. This would not be a problem for a hardware implementation, but it would be unfavorable for an implementation in the firmware of a microcontroller, because six separate timers are required.

Starting from the zero crossing of the supply phase "La" in FIG. 5 (e.g. L1), the timing elements Tv1a, Tv1b, TV2a, Tv2b, Tv3a, Tv3b are triggered in such a way that the clock signals S3a to S3f switch exactly at the capture times described above. These are each fed to a flip-flop 14a to 14f for the clock input. The comparator signal S1 is present at the data input D in each case. In this way, the status of the comparator signal S1 at the relevant time is stored in the flip-flops 14a to 14f. For each phase, this corresponds to the values at the times T/8 and 3T/8 starting from the zero crossing of the relevant phase, wherein the sinusoidal signal has the same value at the times T/8 and 3T/8. The clock signals S3a to S3f are different. The flip-flops 14a to 14f can be edge-controlled.

These are the first and second status signals S4a, S4b for the first phase "La" (supply phase, e.g. L1), the third and fourth status signals S4c, S4d for the second phase "Lb" (e.g. L2), and the fifth and sixth status signals S4e, S4f for the third phase "Lc" (e.g. L3). The two signals for each phase are compared with one another by the XOR gates 15a, 15b, 15c and the multiplexers 16a, 16b, 16c are controlled accordingly by their output signals, namely the first, second and third processing signals S51, S52, S53. If each of the two status signals are the same, the value is used as the first, second and third output signals S41, S42, S43, and if not, the previous value of the output signal S41, S42, S43 is maintained. Lastly the output signals S41, S42, S43 are processed by the OR gate 20 and an alternating voltage status signal S6 at the output of the OR gate 20 and from this the output signal is generated at the output S7.

In the logic circuit 19 shown in FIG. 7, the outputs of the first and the last timing element 12f, 12e are connected to the flip-flops 14e, 14f. The outputs of the second and third timing elements 12a, 12b are connected to the flip-flops 14a, 14b and the outputs of the fourth and fifth timing elements 12c, 12d are connected to the flip-flops 14c, 14d. One timer which implements the logic circuit 19 is advantageously sufficient in the microcontroller.

Figure 8:
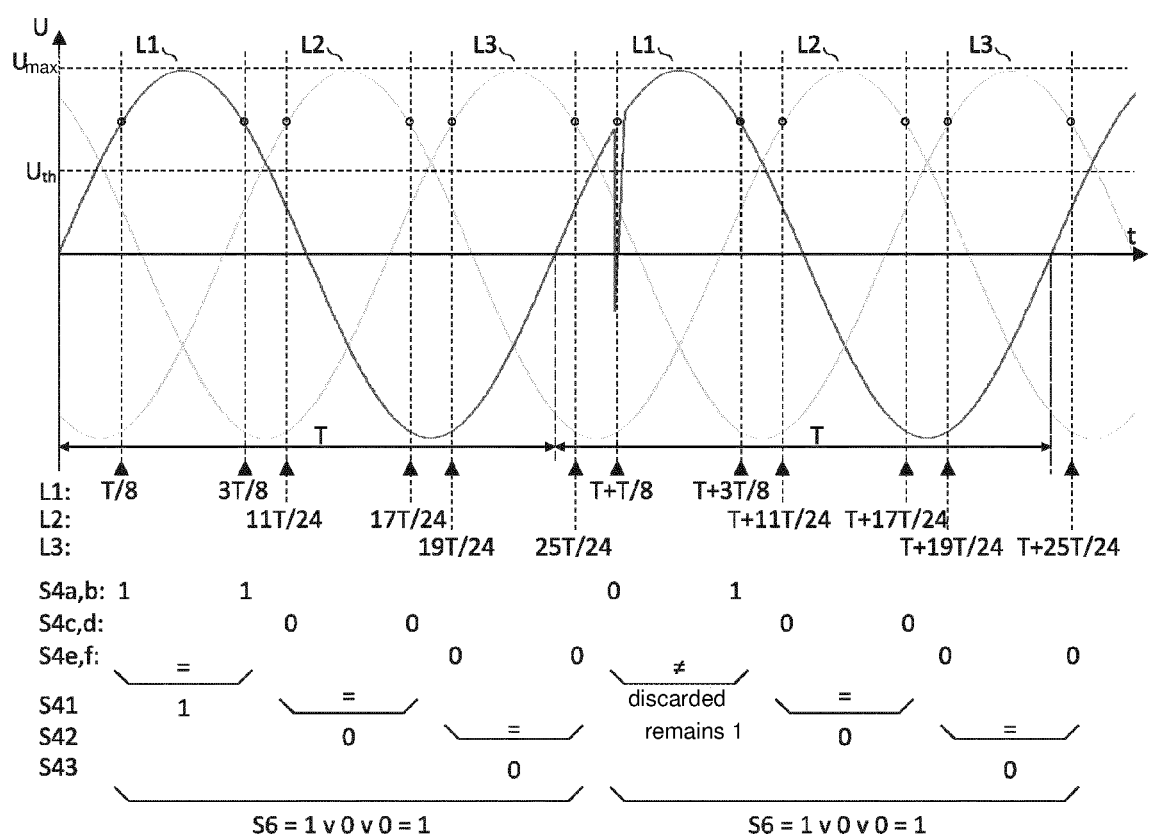

FIG. 8 shows, for example, the case with an active input signal Ik=1 or "high" or uin(t)=Umax sin(ωt) fed from the supply phase (in this case L1), which is falsified in the second period by a negative interference pulse at the time of the first capture in T/8. In the first period, S4a=S4b=1, S4c=S4d=0, S4e=S4f=0. Since in each case the two values per phase are the same, they are all passed on to the outputs of the multiplexers 16a-16c, i.e. S41=1, S42=0, S43=0 and the alternating voltage status signal S6=1 at the output of the OR gate 20. In the second period, the interference falsifies the first capture in T/8, as a result of which S4a=0 and S4b=1. Since S4a S4b, by SM=1 the XOR gate 15a switches the multiplexer 16a to input "1" and the first output signal S41 is retained as S41=1. The other captured values are always the same, S4c=S4d=0, S4e=S4f=0 and are thus passed on as the second output signal S42=0 or third output signal S43=0. The OR link again results in the alternating voltage status signal S6=1, thus eliminating the interference.

Figure 9:
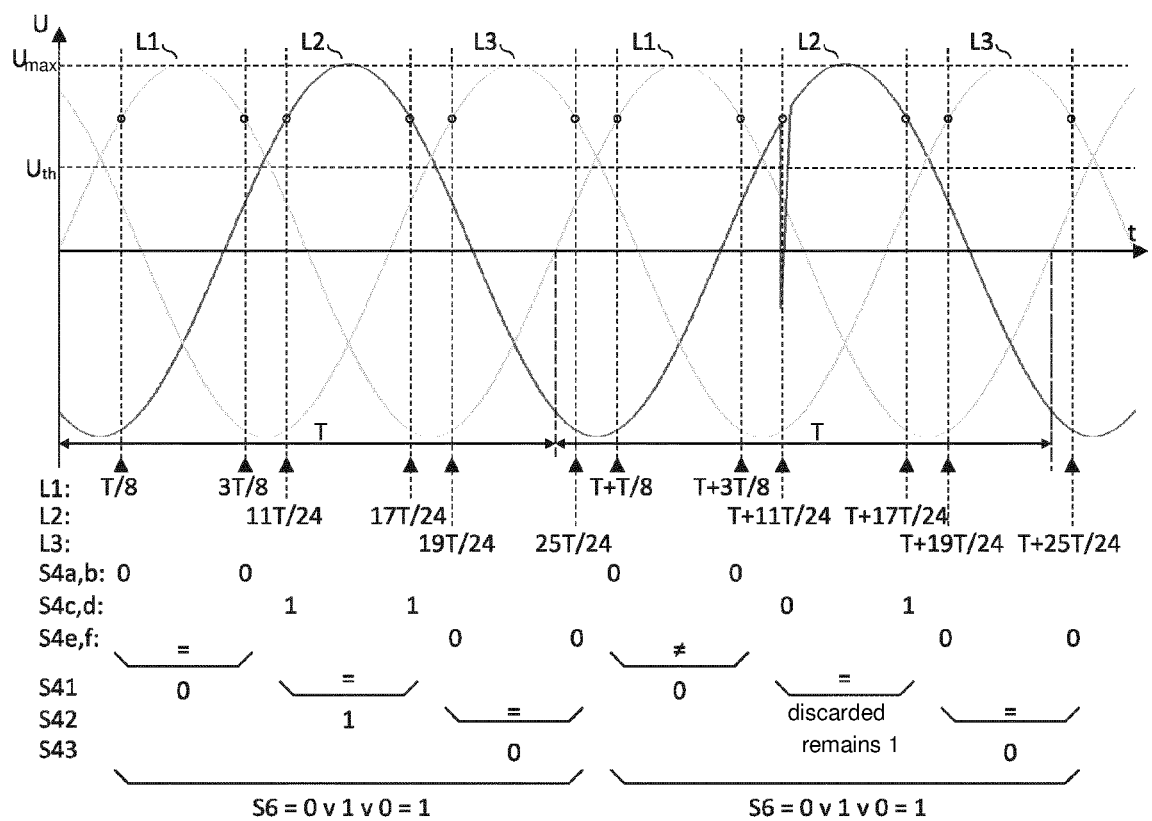

FIG. 9 shows, for example, the case with an active input signal Ik=1 or "high" or uin(t)=Umax sin [ω(t−T/3)] from the next phase after the supply phase (in this case L2), which is falsified in the second period by a negative interference pulse at the time of the first capture in 11T/24. In the first period, S4a=S4b=0, S4c=S4d=1, S4e=S4f=0. Since in each case the two values per phase are the same, they are all passed on to the outputs of the multiplexers 16a-16c, i.e. S41=0, S42=1, S43=0 and S6=1 at the output of the OR gate 20. In the second period the interference falsifies the first capture in 11T/24, whereby S4c=0 and S4d=1. Since S4c S4d, the XOR gate 15b switches the multiplexer 16b to input "1" by the second processing signal S52=1 and the second output signal S42 is maintained as S42=1. The other captured values are each the same, S4a=S4b=0, S4e=S4f=0 and are thus passed on to S41=0 or S43=0. The OR link again results in S6=1, thus eliminating the interference.

Figure 10:
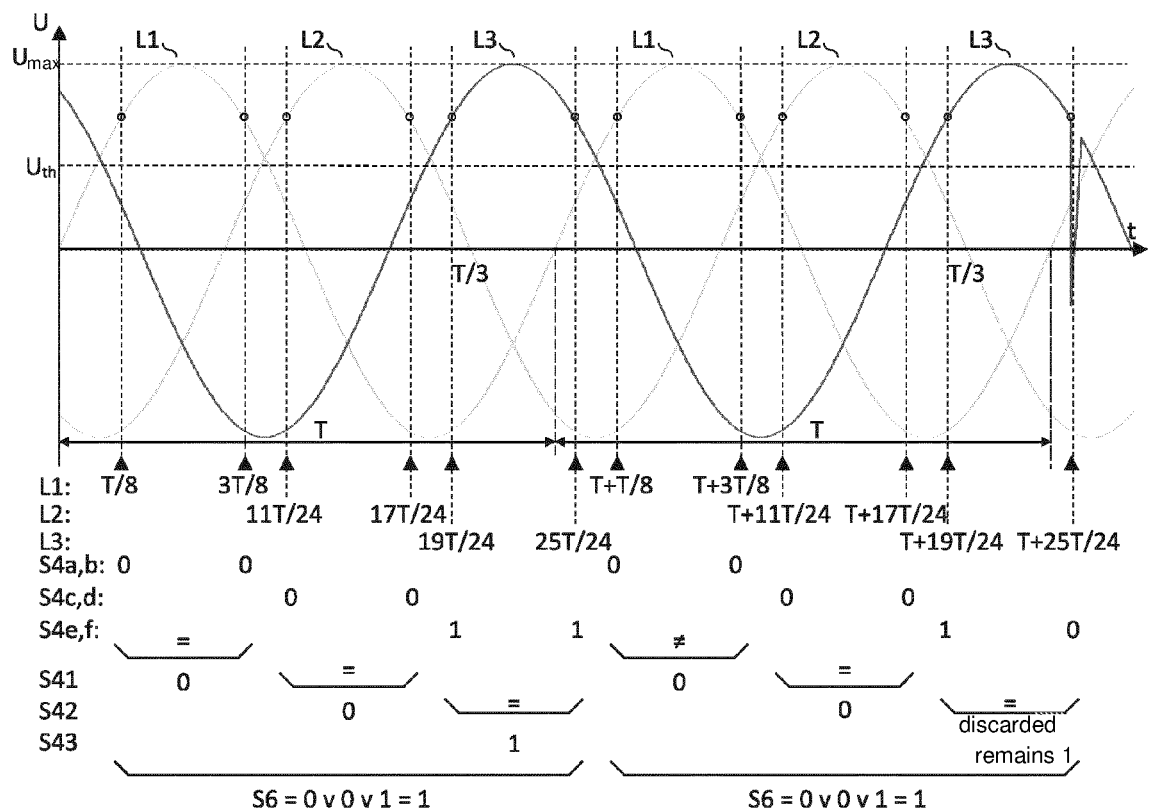

FIG. 10 shows, for example, the case with an active input signal Ik=1 or "high" or uin(t)=Umax sin [ω(t−2T/3)] which is fed from the third phase after the supply phase (in this case L3) and is falsified in the second period by a negative interference pulse, this time actually at the time of the second capture in 25T/24. In the first period, S4a=S4b=0, S4c=S4d=0, S4e=S4f=1. Since in each case the two values per phase are the same, they are all passed on to the outputs of the multiplexers 16a-16c, that is S41=0, S42=0, S43=1 and S6=1 at the output of the OR gate 20. In the second period, the interference falsifies the second capture in 25T/24, whereby S4e=1 and S4f=0. Since S4e S4f the XOR gate 15c switches the multiplexer 16c to input "1" by the third processing signal S53=1 and the third output signal S43 is maintained as S43=1. The other captured values are each the same, S4a=S4b=0, S4c=S4d=0 and are thus passed on to S41=0 or S42=0. The OR link again results in S6=1, thus eliminating the interference.

The interference suppression works in the same way if the input signal Ik is 0. Regardless of the capture time at which positive interference falsifies the input value of 0 to 1, this individual interference is eliminated. By way of example, FIG. 11 shows the case when the inactive input signal (Ik=0 or "low" or uin(t)=0) is falsified by a positive interference pulse in the second period at the time 17T/24—this corresponds to the second reading point of the second phase, in this case the phase L2, if the supply phase L1. In the first period, all captured values are S4a-S4f=0 and are passed on to the multiplexer outputs with the output signals S41-S43.

The OR gate 20 then results in S6=0. In the second period, the interference falsifies the signal S4d=1. Because S4c=0 and so S4c S4d, the XOR gate 15b switches the multiplexer 16b to input "1" by S52=1 and the output remains S42=0. The other captured values are in each case the same, S4a=S4b=0, S4e=S4f=0 and are thus passed on as the first and third output signal S41=0 and S43=0. The OR link again results in S6=0, and thus the interference is eliminated.

This mainly applies to AC operation. For universal devices that can be supplied with both AC and DC, with corresponding AC or DC inputs, a controllable changeover switch 18 between the AC and DC operation can be provided at the output of the logic circuit 19. As a result, either the comparator signal S1 for DC operation or the alternating voltage status signal S6 for AC operation is switched on directly at the output S7. The control takes place via a circuit by the detector signal S2 or from one of the clock signals S3a to S3f. In the case of the AC supply, these signals are pulsed, and in the case of the DC supply, they are static. The pulses could, for example, control a retriggerable monoflop (monostable multivibrator) and thus differentiate between AC (output active) and DC (output inactive).

For example, the logic block 19 is implemented in the firmware of a microcontroller.

The different methods are shown in tabular form in FIGS. 12 to 14, which specify different methods for implementing the logic function in the firmware of a microcontroller. A timing element can be designated to as a timer. An interruption can also be designated as an interrupt.

FIG. 12 shows a table which specifies a method for single-phase firmware implementation. The table describes the method for detecting and suppressing interference of single-phase inputs, see FIG. 1A.

FIG. 13 shows a table which explains a method for three-phase firmware implementation with two timers. The table describes the method for detecting and suppressing interference of three-phase inputs with two internal timers in the microcontroller, see FIG. 5. The two timers could alternatively be used one after the other or arbitrarily, the only restriction being that the time from time 0 and the last time from 19T/24 would have to be implemented with different timers, because they sometimes run at the same time.

FIG. 14 shows a table which specifies a method for three-phase firmware implementation with exactly one timer. The table describes the method for detecting and suppressing interference of three-phase inputs with an internal timer in the microcontroller, see FIG. 7.

Figure 15B:
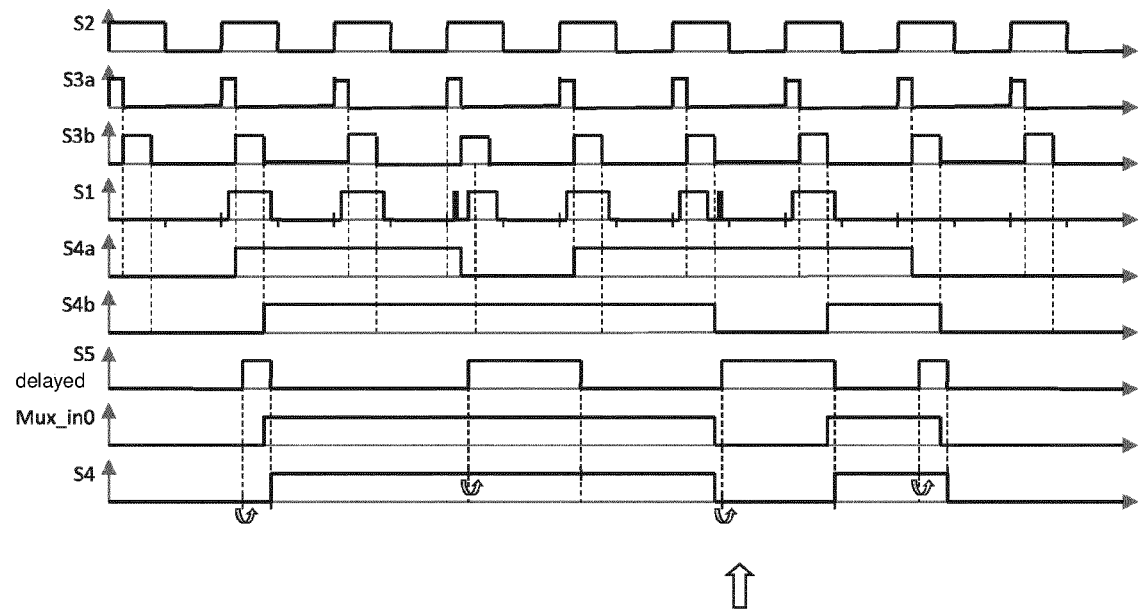
Figure 15C:
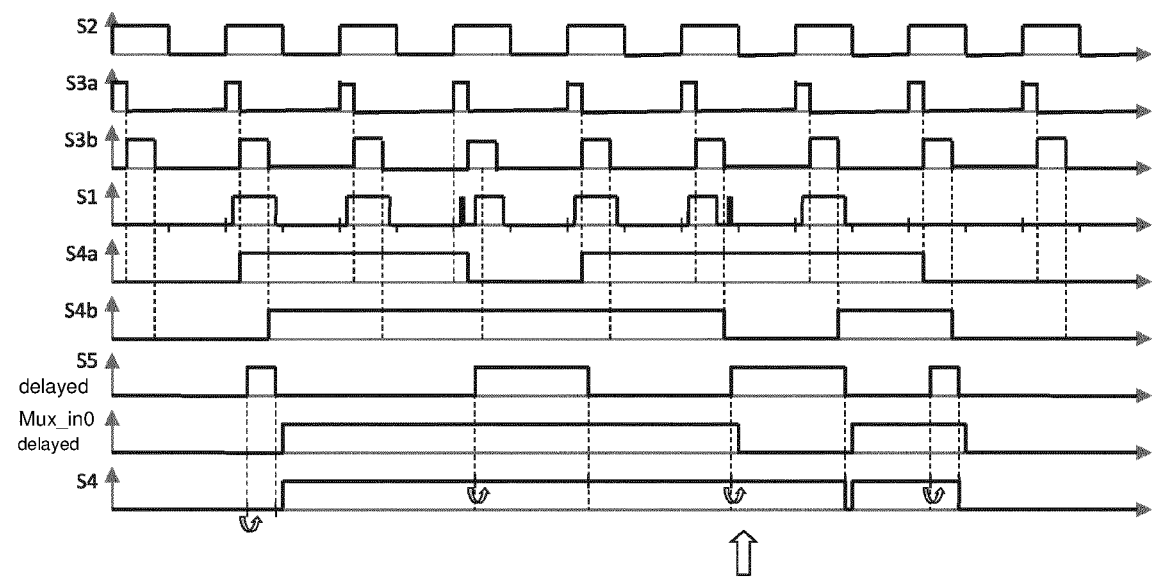

FIGS. 15A to 15C show an example of a detail of the circuit arrangement shown above and signals of the circuit arrangement. In order for a hardware circuit as shown in FIG. 1A to function correctly with the multiplexer, an additional delay (e.g. an RC element) can be provided between the output of the second flip-flop 14b, at which the second status signal S4b is provided, and the input "0" of the multiplexer 16a. A delay element 25 is arranged between the output of the second flip-flop 14b and the input "0" of the multiplexer 16a. The delay element 25 can be implemented as a filter, e.g. as a low pass or RC element or as series-connected inverters.

In principle, correct functioning is ensured in the event of a signal change in that the second status signal S4b, and not the first status signal S4a, is fed to the input 0 of the multiplexer 16a. If the status of the comparator signal S1 changes (from 0 to 1 or from 1 to 0), the first status signal S4a switches over first and the second status signal S4b only switches over after T/4. The change of status from the first status signal S4a switches the multiplexer 16a to the input "1," by the first processing signal S51, while the second status signal S4b is still stable at the old value, namely the same as the first output signal S41. This means that there are no problems when switching over, the old value being initially retained. If the second status signal S4b also assumes the new value after T/4, the multiplexer 16a switches over to input "0" and the new value is passed on as the first output signal S41.

Even if interference falsifies the value of S4a, the described mechanism does not cause any problems, and S41 remains at the old value, as does S4b.

A problem would actually arise if interference falsifies the value of S4b, S4a remaining at the old value. Because S4a S4b, the multiplexer 16a would switch to input "1" in order to retain the old value, but with the delay caused by the XOR gate 15a and its own switchover time. In the meantime, however, the wrong value of S4b would already be passed on to S41 and when the multiplexer 16a is switched over, the new, incorrect value would be retained and not the previous one. In order for the circuit to function properly, it makes sense to delay the signal S4b to the input "0" of the multiplexer 16a, which is greater than that of the switchover signal, that is to say of the first processing signal S51. In practice the circuit could be implemented e.g. as in FIG. 15A. In practice, an additional delay of the signal S4b to the input "0" of the multiplexer 16a could be useful for a hardware implementation, in order to ensure a perfect switchover function.

This has no significance for the software implementation. Implementation by means of software can take place without the delay element 25.

In FIGS. 15B and 15C for explanation of the function, two diagrams are shown for the case with a delay of the second status signal S4b to the multiplexer 16a and the case without such a delay.

FIG. 15B explains a function diagram without a delay of the second status signal S4b. The second status signal S5 is delayed by the XOR gate 15a (exaggerated in the illustration). The interference of the second status signal S4b is not eliminated because the second status signal S4b subject to interference arrives at the multiplexer input "0" faster than the multiplexer 16a switches over.

FIG. 15C explains a function diagram with a delay of the second status signal S4b. The first processing signal S51 is delayed by the XOR gate 15a, but the second status signal S4b subject to interference is delayed even longer to the multiplexer input "0" (exaggerated in the illustration). The interference of the second status signal S4b is eliminated. Because of the delay of the second status signal S4b, a small swipe in the direction of 0 still occurs at the "end of the interference." However, in reality the delays are very small (in the 10 ns to 100 ns range) and the swipe is smoothed out, i.e. eliminated, without problems with additional filtering of the first output signal S41.

The documents EP0935758B1, DE102017116534A1 and DE102017127070.1 are incorporated herein by reference (e.g. to explain details of the circuit arrangement and the method).

As stated, the embodiments illustrated in FIG. 1A to 15C represent embodiments of the improved circuit arrangement and the method, and therefore do not represent a complete list of all embodiments of the improved circuit arrangement. The actual configurations of the circuit arrangement can deviate from the embodiments which are shown, for example, with regard to circuit parts, method steps or circuit parameters such as delay times.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A circuit arrangement for monitoring an alternating voltage signal, comprising:
   a comparator configured to receive the alternating voltage signal or a signal obtained from the alternating voltage signal at a first comparator input and output a comparator signal at a comparator output as a function of a comparison of the alternating voltage signal or output the signal obtained therefrom with a defined threshold value,
   a zero crossing detector configured to receive a reference signal or a signal obtained from the reference signal at a monitoring input and generate a detector signal at an output of the zero crossing detector, and
   a logic circuit,
   wherein the reference signal has the form of an alternating current (AC) signal and the reference signal and the alternating voltage signal have the same frequency,
   wherein the logic circuit comprises:
   a first timing element connected downstream of the zero crossing detector for generating a first clock signal as a function of the detector signal,
   a second timing element connected downstream of the zero crossing detector for generating a second clock signal as a function of the detector signal or as a function of the first clock signal,
   a first and a second flip-flop, and
   an exclusive-OR gate,
   wherein an output of the comparator is coupled to a data input of the first flip-flop and the second flip-flop,
   wherein an output of the first timing element is coupled to a clock input of the first flip-flop and an output of the second timing element is coupled to a clock input of the second flip-flop,
   wherein an output of the first flip-flop and an output of the second flip-flop are coupled to inputs of the exclusive-OR gate,
   wherein the exclusive-OR gate is configured to generate a first processing signal,
   wherein the logic circuit is configured to sample the comparator signal at at least two predefined times and to generate the first processing signal with a first value if the comparator signal has different values at two particular times of the at least two predefined times, and to generate a second value if the comparator signal has the same value at the two particular times, and
   wherein the two particular times of the at least two predefined times have the following values:

$T/4-\Delta t$ and $T/4+\Delta t$, where T is a period duration of the alternating voltage signal to be monitored and $\Delta t$ is a time period of less than $T/4$.

2. The circuit arrangement according to claim 1,
   wherein the logic circuit is configured
   to generate, at the second value of the first processing signal, a first output signal that has the value of the comparator signal sampled at the two particular times, and
   to maintain the previous value of the first output signal at the first value of the first processing signal.

3. The circuit arrangement according to claim 1,
   wherein the logic circuit is configured to generate a second processing signal with a first value if the comparator signal has different values at two further particular times of the at least two predefined times, and with a second value if the comparator signal has the same value at the two further particular times, and
   wherein the logic circuit is configured to generate a third processing signal with a first value if the comparator signal has different values at two additional particular times of the at least two predefined times, and with a second value, if the comparator signal has the same value at the two additional particular times.

4. The circuit arrangement according to claim 3,
   wherein the logic circuit is configured
   to generate, at the second value of the second processing signal, a second output signal which has the value of the comparator signal sampled at the two further particular times, and
   to maintain the previous value of the second output signal at the first value of the second processing signal,
   to generate, at the second value of the third processing signal, a third output signal which has the value of the comparator signal sampled at the two additional particular times,
   to maintain the previous value of the third output signal at the first value of the third processing signal, and
   to generate an alternating voltage status signal by OR-linking the first, the second and the third output signal.

5. The circuit arrangement according to claim 1, wherein the logic circuit is implemented as a microcontroller or microprocessor.

6. The circuit arrangement according to claim 1,
   wherein the second timing element is connected downstream of the first timing element and is configured to be triggered by the first clock signal to generate the second clock signal.

7. The circuit arrangement according to claim 2,
   wherein the logic circuit comprises a multiplexer and the multiplexer has:
   a first input which is coupled to the output of the first or the second flip-flop,
   a second input,
   a control input which is coupled to an output of the exclusive-OR gate, and
   an output which is coupled to the second input and is configured to output the first output signal.

8. The circuit arrangement according to claim 7, wherein the multiplexer, the exclusive-OR gate, the flip-flops and the timing elements are implemented by software within a microcontroller or microprocessor.

9. The circuit arrangement according to claim 1, wherein the two particular times are T/8 and T·3/8.

10. A method for monitoring an alternating voltage signal, comprising:
capturing the alternating voltage signal,
generating a comparator signal as a function of a comparison of the alternating voltage signal or the signal obtained from the alternating voltage signal with a defined threshold value,
generating a detector signal by a zero crossing detector based on a reference signal or a signal obtained from the reference signal, and
sampling the comparator signal at at least two predefined times and generating a first processing signal with a first value if the comparator signal has different values at two particular times of the at least two predefined times, and with a second value if the comparator signal has the same value at the two particular times,
wherein the reference signal has the form of an alternating current (AC) signal, and the reference signal and the alternating voltage signal have the same frequency,
wherein the two particular times of the at least two predefined times have the following values:

$T/4-\Delta t$ and $T/4+\Delta t$, where T is a period duration of the alternating voltage signal to be monitored and $\Delta t$ is a time period of less than T/4,
wherein a logic circuit comprises:
a first timing element connected downstream of the zero crossing detector for generating a first clock signal as a function of the detector signal,
a second timing element connected downstream of the zero crossing detector for generating a second clock signal as a function of the detector signal or as a function of the first clock signal,
a first and a second flip-flop and
an exclusive-OR gate,
wherein an output of the comparator is coupled to a data input of the first flip-flop and the second flip-flop,
wherein an output of the first timing element is coupled to a clock input of the first flip-flop and an output of the second timing element is coupled to a clock input of the second flip-flop,
wherein an output of the first flip-flop and an output of the second flip-flop are coupled to inputs of the exclusive-OR gate, and
wherein the exclusive-OR gate generates the first processing signal.

* * * * *